April 19, 1966 I. L. FISCHER ETAL 3,247,388

CIRCUIT FOR IMPROVING THE FREQUENCY RESPONSE OF PHOTOELECTRIC DEVICES

Filed May 11, 1962

INVENTORS
ISRAEL L. FISCHER
RICHARD WOLFSON
EDWARD KRESCH
BY [signature]
ATTORNEY United States Patent Office 3,247,388
Patented Apr. 19, 1966

3,247,388

CIRCUIT FOR IMPROVING THE FREQUENCY RESPONSE OF PHOTOELECTRIC DEVICES

Israel L. Fischer, Harrington Park, Richard Wolfson, Teaneck, and Edward Kresch, Bayonne, N.J., assignors to The Bendix Corporation, Teterboro, N.J., a corporation of Delaware Filed May 11, 1962, Ser. No. 193,989
10 Claims. (Cl. 250—214)

The invention relates generally to photoelectric devices and more particularly to a circuit for improving the response of a photoelectric device to pulsating light signals at higher frequencies.

Photoelectric devices convert light signals into electrical signals. Photoelectric devices are not sensitive to the frequency of pulsating light signals below a predetermined or "cutoff" frequency but are frequency sensitive above the predetermined frequency in that the corresponding electrical signals become smaller, distorted, and unusable. The predetermined or "cutoff" frequency is the frequency at which the output signal is .707 of its maximum value and may vary from one kilocycle to as high as one megacycle depending upon the type and construction of the photoelectric device. A chart listing cutoff frequencies of several photoelectric devices may be found in Hunter, Handbook of Semiconductor Electronics, cf. p. 5–8, McGraw-Hill (1956).

One object of the invention is to provide a novel circuit, using a photoelectric device, to obtain a useful response from the photoelectric device at a frequency above the cutoff frequency.

Another object of the invention is to provide a novel circuit including a photoelectric device for providing electrical signals corresponding in shape, relative amplitude, and time phase to random light signals applied to the photoelectric device where the frequencies of the light signals are within a restricted range of frequencies above the cutoff frequency of the photoelectric device.

Another object of the invention is to provide a novel circuit including a photoelectric device providing electrical signals from light signals of a frequency above the cutoff frequency of the photoelectric device.

The invention contemplates a circuit including a photoelectric device having a cutoff frequency and a tuned amplifier connected to the photoelectric device and having a peaked input signal vs. frequency gain response with a center frequency greater than the cutoff frequency of the photoelectric device. The circuit provides usable output electrical signals over a frequency range at and near the center frequency of the tuned amplifier which frequencies are in excess of the cutoff frequency of the photoelectric device.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

Figure 1:
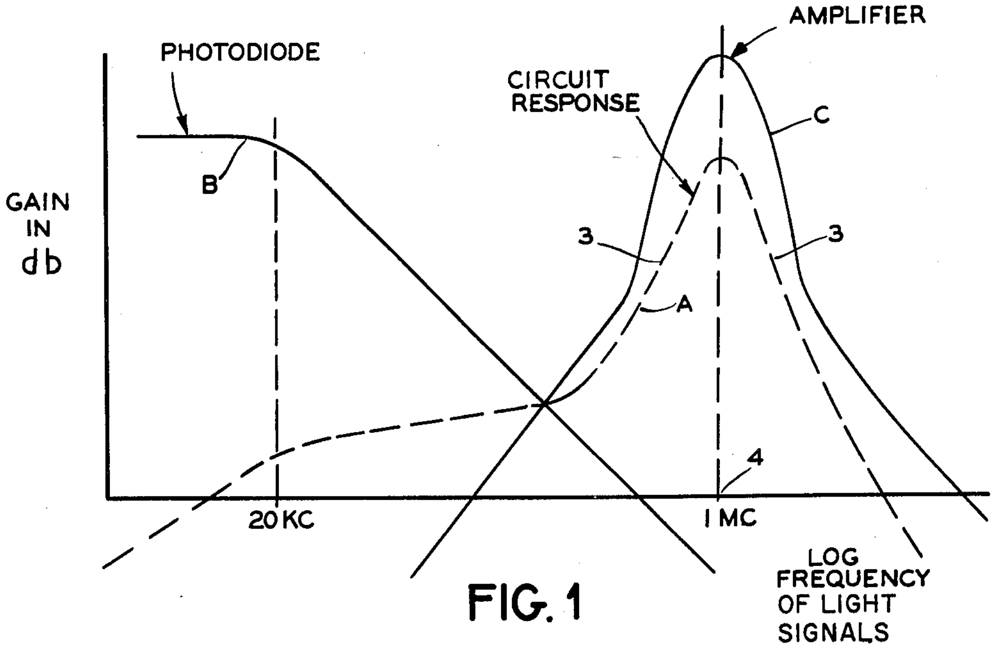
FIGURE 1 shows in curve A the frequency response of a circuit constructed according to the invention, and in curves B and C the separate responses of the photoelectric device and the amplifier used in the circuit.

In FIGURE 1, the frequency of the light signals in log cycles per second is plotted on the abscissa, and the gain in decibels is plotted on the ordinate. Curve B is the frequency response curve of a typical photoelectric device, which, for example, may be a Texas Instrument NPN diffused silicon photo-duo-diode type 1N2175. The frequency response is substantially flat up to 20 kilocycles, the cutoff frequency of the diode, and then from this point, the gain decreases or has a roll off of 6 db per octave.

Figure 2:
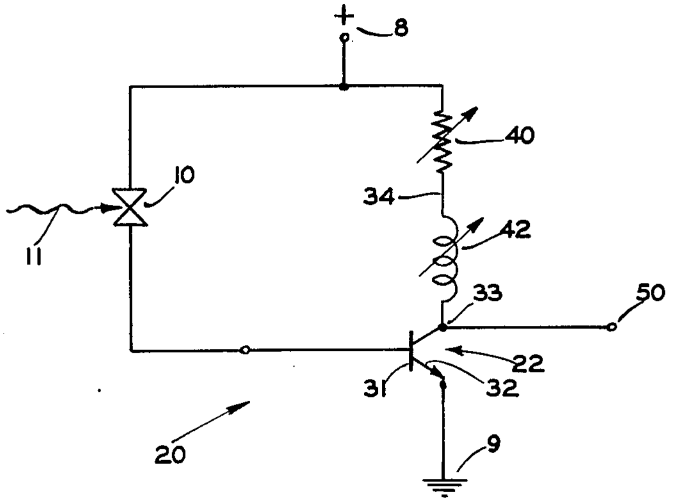
FIGURE 2 is a schematic diagram of a novel circuit including a photoelectric device and an amplifier constructed in accordance with the invention.

Curve C is the frequency response curve of the amplifier 20 shown in FIGURE 2 and the curve shows a tuned amplifier, having a peaked input signal vs. frequency gain response 3 and a center frequency 4 (for example, at 1 $M_c$.) considerably beyond the cutoff frequency 20 kc. of the photodiode.

Curve A is the frequency response curve of the circuit of FIGURE 2, and is a composite of the frequency response curves B and C. The frequency response of the circuit (curve A) increases gradually from very low frequencies and then increases sharply as the frequencies of light signals approach the center frequency 4. In a range of frequencies near the center frequency, there is a sharp gain; and for frequencies above this range, the gain rapidly falls off. The circuit is particularly well suited to provide usable electrical signals where the frequency of the light signals is in a frequency range near the center frequency.

The novel circuit constructed in accordance with the present invention and shown in FIGURE 2 comprises a source of direct current electrical potential 8 connected to a photoelectric device 10 which, for example, may be the 1N2175 diode referred to above. A light signal 11 falling on diode 10 provides a corresponding change in the diode's resistance, and the potential from source 8, impressed on diode 10, provides a current signal in accordance with the diode's resistance. The current signal has a frequency response as shown in curve B of FIGURE 1.

The current signal from photodiode 10 is applied to an amplifier 20. Amplifier 20 includes a transistor 22 having a base 31 connected to the diode 10 for receiving the current signal, an emitter 32 connected to a reference potential shown here as ground potential 9, and a collector 33 connected through a load 34 to direct current source of potential 8. The load includes a series combination of a resistor 40 and an inductor 42. The purpose of inductor 42 in load 34 is to act with the Miller capacitance of transistor 22 so that inductance 42 is reflected back to input 31 resulting in a tuned circuit from base 31 to ground 9. An output signal is provided between emitter 32 and an output terminal 50 connected to collector 33.

This type of tuned amplifier is well known and has a frequency response curve similar to curve C of FIGURE 1. The center frequency 4 of the frequency response curve can be changed by adjusting the value of inductor 42 and by selecting the type of transistor 22. The steepness of the peaking 3 can be varied by adjusting the inductance of inductor 42 and the resistance of resistor 40 and selecting the type of transistor 22.

By using a photodiode which changes resistance when exposed to light and connecting the photodiode to direct current source 8, the amplifier tuning is not disturbed and the center frequency does not change.

The tuned amplifier shown herein is sometimes called a compensated broadband or shunt compensated amplifier. There are may varieties of tuned amplifiers that have the frequency response of the type shown in curve C, and any amplifier having these characteristics may be substituted for the amplifier shown without departing from the scope of the invention.

While there are many different values of circuit parameters for which the circuit shown in FIGURE 2 will function satisfactorily, the following circuit parameters may be used for a center frequency of one megacycle and are given by way of example only.

| | | |
|---|---|---|
| Diode 10 | | 1N2175 |
| Transistor 10 | | 2N708 |
| Resistor 40 | ohms | 300 |
| Inductor 42 | microhenries | 100 |
| Source of electrical potential 8 | volts D.C. | +22 |

The present invention is a novel circuit using a photoelectric device to obtain a useful response from the photoelectric device at a frequency above the cutoff frequency.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A circuit including a variable resistance photoelectric device having a light signal cutoff frequency, a tuned amplifier having a peaked input signal vs. frequency gain response and having an input connected to the photoelectric device and tuned in a center frequency greater than the light signal cutoff frequency of the photoelectric device and having an output providing usable electrical signals over a frequency range at and near the center frequency, the photoelectric device changing resistance when exposed to light and providing signals to the amplifier without changing the center frequency of the amplifier.

2. A circuit comprising (a) a variable resistance photoelectric device adapted to provide electric signals in accordance with light signals and having a light signal cutoff frequency, and (b) a tuned amplifier having a peaked input signal vs. frequency gain response and having an input connected to the photoelectric device for receiving the electric signals and tuned to a center frequency greater than the light signal cutoff frequency and having an output providing usable electrical signals in accordance with the light signals at frequencies beyond the light signal cutoff frequency of the photoelectric device, and at and adjacent to the center frequency of the tuned amplifier, the photoelectric device changing resistance when exposed to light and providing signals to the amplifier without changing the center frequency of the amplifier.

3. A circuit of the kind described in claim 2 in which the tuned amplifier has means for shunt compensating the amplifier.

4. A circuit comprising a variable resistance photoelectric device for providing electric signals in accordance with light signals and having a light signal cutoff frequency, a tuned amplifier having a peaked input signal vs. frequency gain response and tuned to a center frequency greater than the light signal cutoff frequency of the photoelectric device, said amplifier including a transistor having a base receiving the electrical signals and a collector providing usable electrical signals in accordance with the light signals at frequencies beyond the light signal cutoff frequency of the photoelectric device and at and adjacent to the center frequency of the tuned amplifier, and a load circuit connected to the collector and including inductive means for providing peaked gain response at the center frequency.

5. A circuit comprising (a) a photodiode adapted to change resistance in accordance with an applied light signal, (b) a source of potential connected to the diode for providing current signals in accordance with diode resistance, (c) a transistor having a base directly connected to the diode for receiving the current signals, an emitter connected to a reference potential and a collector, and (d) load means including inductive means providing a tuned load and a peaked input signal vs. frequency gain response connected between the collector and the source of potential.

6. A circuit comprising (a) a photodiode adapted to change resistance in accordance with an applied light signal and having a light signal cutoff frequency, (b) a source of potential connected to the diode for providing a current signal in accordance with the resistance of the diode, (c) a reference potential, (d) a transistor having a base connected to the diode for receiving the current signal, an emitter connected to the reference potential, and a collector, (f) load means including inductive means providing a tuned load and a peaked input signal vs. frequency gain response above the light signal cutoff frequency and connected between the collector and the source of potential, and an output connected to the collector and providing usable signals over a frequency range beyond the light signal cutoff frequency and in the vicinity of the peaked gain frequency.

7. A circuit including a variable resistance photoelectric device to provide usable electric signals over a frequency range substantially above the light signal cutoff frequency of the photoelectric device, an amplifier having a peaked input signal vs. frequency gain response and tuned to a center frequency substantially at the center of the frequency range and greater than the light signal cutoff frequency of the photoelectric device, said amplifier having an input connected to the photoelectric device and having an output providing usable electric signals over the said frequency range, the photoelectric device changing resistance when exposed to light and providing signals to the amplifier without changing the center frequency of the amplifier.

8. A circuit including a variable resistance photo diode for providing usable electric signals over a frequency range substantially above the light signal cutoff frequency of the photo diode, an amplifier having a peaked input signal vs. frequency gain response and tuned to a center frequency substantially at the center of the frequency range and greater than the light signal cutoff frequency of the photo diode, said amplifier having an input connected to the photo diode and having an output providing usable electric signals over the said frequency range, the photo diode changing resistance when exposed to light and providing signals to the amplifier without changing the center frequency of the amplifier.

9. A circuit including a variable resistance photoelectric device having a light signal cutoff frequency, an amplifier having a peaked input signal vs. frequency gain response and tuned to a center frequency greater than the light signal cutoff frequency of the amplifier and having an input connected to the photoelectric device, direct current means connected to the photoelectric device so that resistance of the photoelectric device changes with changes in light intensity without changing the center frequency of the amplifier, and said amplifier having an output providing usable electric signals over a frequency range at and near the center frequency.

10. A circuit for use with a variable resistance photoelectric device to provide usable electric signals over a frequency range substantially above the light signal cutoff frequency of the photoelectric device, comprising a photo diode having a light signal cutoff frequency and changing resistance with changes in light intensity, an amplifier having a peaked input signal vs. frequency gain response and tuned to a center frequency greater than the light signal cutoff frequency of the photo diode and having an input connected to the photo diode, direct current means connected to the photo diode so that the center frequency of the amplifier is maintained constant when the resistance of the photo diode changes with changes in light intensity, and said amplifier having an output providing usable electric signals over a frequency range at and near the center frequency of the amplifier.

References Cited by the Examiner

UNITED STATES PATENTS

| | | | |
|---|---|---|---|
| 2,964,637 | 12/1960 | Keizer | 250—211 |
| 3,005,915 | 10/1961 | White et al. | 250—214 |
| 3,081,399 | 3/1963 | Schwarz | 307—88.5 |

RALPH G. NILSON, *Primary Examiner.*

WALTER STOLWEIN, *Examiner.*